United States Patent
Cheng et al.

(10) Patent No.: US 9,246,007 B2
(45) Date of Patent: Jan. 26, 2016

(54) OXIDE THIN FILM TRANSISTOR AND METHOD FOR MANUFACTURING THE SAME, ARRAY SUBSTRATE, AND DISPLAY APPARATUS

(71) Applicant: BOE Technology Group Co., Ltd., Beijing (CN)

(72) Inventors: Jun Cheng, Beijing (CN); Woobong Lee, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 13/994,746

(22) PCT Filed: Oct. 9, 2012

(86) PCT No.: PCT/CN2012/082653
§ 371 (c)(1),
(2) Date: Jun. 16, 2013

(87) PCT Pub. No.: WO2013/139120
PCT Pub. Date: Sep. 26, 2013

(65) Prior Publication Data
US 2014/0110702 A1    Apr. 24, 2014

(30) Foreign Application Priority Data

Mar. 21, 2012 (CN) .......................... 2012 1 0076883
May 4, 2012 (CN) .......................... 2012 1 0138023

(51) Int. Cl.
*H01L 29/786*  (2006.01)
*H01L 29/66*   (2006.01)

(52) U.S. Cl.
CPC .... *H01L 29/78606* (2013.01); *H01L 29/66969* (2013.01); *H01L 29/7869* (2013.01)

(58) Field of Classification Search
CPC ............ H01L 29/786; H01L 29/66765; H01L 29/78606; H01L 29/66969; H01L 29/7869; H01L 29/4908
USPC .......... 257/43, 223, 227, 291, 292, 439, 443, 257/655, E27.1, E27.125, E27.112, 257/E29.117, E29.145, E29.147, E29.151, 257/E29.182, E29.202, E29.273–E29.299, 257/E29.314, E29.32, E23.016
See application file for complete search history.

(56) References Cited

U.S. PATENT DOCUMENTS 6,563,174 B2    5/2003   Kawasaki et al.
2007/0087492 A1*  4/2007  Yamanaka ................... 438/166

(Continued)

FOREIGN PATENT DOCUMENTS

CN      1405898 A     3/2003
CN      1448998 A    10/2003

(Continued)

OTHER PUBLICATIONS

First Office Action for Chinese Patent Application No. 201210138023X dated Apr. 1, 2014.
English translation of First Office Action for Chinese Patent Application No. 201210138023X dated Apr. 1, 2014.
International Search Report for International Application No. PCT/CN2012/082653 dated Jan. 17, 2013.

(Continued)

*Primary Examiner* — Jae Lee
*Assistant Examiner* — Mohammed R Alam
(74) *Attorney, Agent, or Firm* — Ladas & Parry LLP

(57) ABSTRACT

Disclosed are an oxide thin film transistor (oxide-TFT) which can prevent H+ ions from invading into an active layer to maintain a stable characteristics of the TFT, a method for fabricating the oxide-TFT, an array substrate, and a display apparatus. The oxide-TFT comprises a substrate (200), and a gate electrode (201) and a gate insulating layer (202) sequentially disposed on the substrate. An active layer (203) is disposed on the gate insulating layer and is coated with a blocking layer, which at least comprises a first blocking layer (204) and a second blocking layer (205).

5 Claims, 1 Drawing Sheet

(56) References Cited

U.S. PATENT DOCUMENTS

| | | | |
|---|---|---|---|
| 2008/0318429 A1* | 12/2008 | Ozawa et al. ................ 438/695 |
| 2009/0315026 A1 | 12/2009 | Jeong et al. |
| 2010/0176388 A1 | 7/2010 | Ha et al. |
| 2010/0283049 A1* | 11/2010 | Sato et al. ...................... 257/43 |
| 2011/0279144 A1* | 11/2011 | Kamata ................... 324/762.09 |
| 2011/0309369 A1* | 12/2011 | Zhang ............................ 257/72 |
| 2014/0110702 A1 | 4/2014 | Cheng et al. |

FOREIGN PATENT DOCUMENTS

| | | |
|---|---|---|
| CN | 101609846 A | 12/2009 |
| CN | 101794819 A | 8/2010 |
| CN | 101884109 A | 11/2010 |
| CN | 102683422 A | 9/2012 |
| JP | 2007-073562 | 3/2007 |

OTHER PUBLICATIONS

PCT International Preliminary Report on Patentability issued by the International Bureau of WIPO on Sep. 23, 2014 for International application No. PCT/CN2012/082653, 12 pages.

Second Office Action for Chinese Patent Application No. 201210138023X dated Nov. 15, 2014; seven (7) pages.

English translation of Second Office Action for Chinese Patent Application No. 201210138023X dated Nov. 15, 2014; five (5) pages.

English abstract of CN1448998A, one (1) page.

Third Office Action issued by State Intellectual Property Office of People's Republic of China, for Chinese Patent Application No. 201210138023X, dated Apr. 20, 2015—5 pages.

English translation of Third Office Action issued by State Intellectual Property Office of People's Republic of China, for Chinese Patent Application No. 201210138023X, dated Apr. 20, 2015—4 pages.

* cited by examiner

US 9,246,007 B2

OXIDE THIN FILM TRANSISTOR AND METHOD FOR MANUFACTURING THE SAME, ARRAY SUBSTRATE, AND DISPLAY APPARATUS

CROSS REFERENCE TO RELATED APPLICATIONS

This application is based on International Application No. PCT/CN2012/082653 filed on Oct. 9, 2012, which claims priority to Chinese National Application No. 201210076883.5 filed on Mar. 21, 2012, and to Chinese National Application No. 201210138023.X filed May 4, 2012 the contents of which are incorporated herein by reference.

TECHNICAL FIELD

Embodiments of the present invention relate to an oxide thin film transistor (oxide-TFT) and a method for manufacturing the same, an array substrate, and a display apparatus.

BACKGROUND

At present, the main component of an active layer of a TFT in a liquid crystal display comprises silicon, such as, amorphous silicon or polysilicon. A TFT employing amorphous silicon as the active layer is hardly used in the situations requiring a large current and a rapid response, such as, an organic light emitting display, a display having a large size, a high resolution, and a high scanning frequency, or the like, due to its characteristic limitations (e.g., mobility, On-state current, etc.). A TFT employing polysilicon as the active layer can be used in an organic light emitting display due to its better characteristics than amorphous silicon; but the TFT has poor uniformity, so it is hard to be used for preparing a large size panel. Therefore, there is an increasing attraction to oxide semiconductor.

A TFT employing an oxide semiconductor as the active layer has better characteristics, such as, mobility, On-state current, switching characteristics, etc., than that employing amorphous silicon. Although certain characteristics of an oxide semiconductor are not as good as polysilicon, it still can satisfy the requirements of applications requiring a rapid response and a large current, such as, a display having a high frequency, a high resolution, and a large size, an organic light emitting display, etc. In general, an oxide has better uniformity than polysilicon, so it can be prepared by a sputtering method or the like without additional equipments, and thus costs can be low.

FIG. 1 is a structure view of an oxide-TFT in the prior art. In the process for fabricating an existing oxide-TFT, source/drain electrodes 105a, 105b are patterned by wet etching. Since an active layer 103 below the source/drain electrodes also can be etched by etchant, an etching blocking layer 104 is typically formed to protect the active layer 103 from being etched during etching of the source/drain metal layer.

The existing etch blocking layer is a single layer of SiOx. Since chemical bonds containing H, such as Si—H bond and N—H bond, may be generated during forming of SiOx, the etching blocking layer usually contains high concentration of H+. Further, the active layer is made of an oxide semiconductor, such as, IGZO, IZO, or the like, and the H+ ions inside both the etch blocking layer and an upper passivation layer may invade into the active layer, so oxygen holes may be changed in the active layer such as IGZO, the threshold voltage (Vth) may shift, and On/Off current (Ion/Ioff) may be reduced, etc. Thus, the property of the TFT is deteriorated, and the usage life of the TFT is shortened.

SUMMARY

Embodiments of the present invention provide an oxide thin film transistor (oxide-TFT) which can prevent H+ ions from invading into an active layer so as to maintain a stable property of the TFT, an array substrate, and a method for fabricating the oxide-TFT.

According to one aspect of the present invention, an oxide-TFT is provided, which comprises a substrate, and a gate electrode and a gate insulating layer sequentially disposed on the substrate; an active layer is disposed on the gate insulating layer and is coated with a blocking layer, which at least comprises a first blocking layer and a second blocking layer.

For example, the first blocking layer is silicon compound, content of hydrogen of which is 0.1%~5%.

For example, the first blocking layer is silicon oxide or silicon nitride.

For example, the second blocking layer is SiOx, in which x is $0.1<x<1$.

For example, the second blocking layer is SiNx, in which x is $1<x<1.33$.

For example, the active layer is an oxide thin film containing at least two elements of In, Ga, Zn, and Sn.

For example, the first blocking layer has a thickness of 50 nm~100 nn, and the second blocking layer has a thickness of 50 nm~100 nm.

For example, source/drain electrodes are disposed on the blocking layer, and a passivation layer and a pixel electrode are disposed on the source/drain electrodes.

For example, the first blocking layer and the second blocking layer are sequentially coated on the active layer.

According to another aspect of the present invention, an array substrate is provided, which comprises any one of the above described oxide-TFTs.

According to still another aspect of the present invention, a display apparatus is provided, which comprises the above described array substrate.

According to still another aspect of the present invention, a method for fabricating an oxide thin film transistor (oxide-TFT) is provided, which comprises: forming a gate electrode layer on a substrate, and forming a pattern comprising a gate electrode and a gate line by a patterning process; forming a gate insulating layer and an active layer; forming a first blocking layer and a second blocking layer; and forming a source/drain metal layer, and forming a pattern comprising source/drain electrodes and a channel region of the TFT by a patterning process.

For example, the first blocking layer is silicon oxide, content of hydrogen of which is 0.1%~5%.

For example, the first blocking layer is prepared under following conditions: a reactive atmosphere is $SiH_4+N_2O+N_2$, a flow ratio of $SiH_4/N_2O$ is 1/40~1/60, a temperature is 150~350° C., and a pressure is 1000 mtorr~2000 mtorr.

For example, the first blocking layer is prepared under following conditions: a reactive atmosphere is $SiH_4+O_2+N_2$, a flow ratio of $SiH_2/O_2$ is 0.2~1, a temperature is 150~350° C., and a pressure is 1000 mtorr~2000 mtorr.

For example, the first blocking layer is silicon nitride, content of hydrogen of which is 01%~5%.

For example, the second blocking layer is SiOx, in which x is $0.01<x<1$.

For example, the second blocking layer is prepared under following conditions: a reactive atmosphere is $SiH_4+N_2O+$ $N_2$, a flow ratio of $SiH_4$ and $N_2O$ is 1/10~1/30, a temperature is 150~350° C., and a pressure is 1500 mtorr~2500 mtorr.

For example, the second blocking layer is prepared under following conditions: a reactive atmosphere is $SiH_4+O_2+N_2$, a flow ratio of $SiH_4/O_2$ is 1~3, a temperature is 150~350° C., and a pressure is 1500 mtorr~2500 mtorr.

For example, the second blocking layer is SiNx, in which 1<x<1.33.

According to the oxide-TFT, the array substrate, and the method for fabricating the oxide-TFT in the embodiments of the present invention, the blocking layer is designed to have a double-layer structure. Since the content of H+ is small in the first blocking layer, the possibility of H+ ions inside the blocking layer invading into the active layer is reduced. In addition, when the H+ ions invade into the second blocking layer to meet Si, Si—H bonds may be formed, so that the invasion of H+ ions into the active layer can be further prevented. Thus, the active layer is effectively protected, and the usage life of the oxide-TFT can be extended.

BRIEF DESCRIPTION OF THE DRAWINGS

In order to clearly illustrate the technical solutions of the embodiments of the present invention, the drawings of the embodiments will be briefly described in the following. It is obvious that the described drawings are only referred to some embodiments of the invention and are not limitative of the present invention.

DETAILED DESCRIPTION

The object, technology solutions, and advantageous of the embodiments of the present invention are more clear by the following clear and complete description of disclosed embodiments, in connection with the drawings. Apparently, only some embodiments of the present invention, but not all embodiments, are set forth here. All of other embodiments made by those skilled in the art based on embodiments disclosed herein without mental work fall within the scope of the present invention.

An embodiment of the present invention provides an oxide-TFT in which the invasion of H+ ions into an active layer can be effectively prevented so that the TFT can be protected, an array substrate having the oxide-TFT and a method for fabricating the same.

An embodiment of the present invention will be described in detail in connection with the company drawings.

Figure 1:
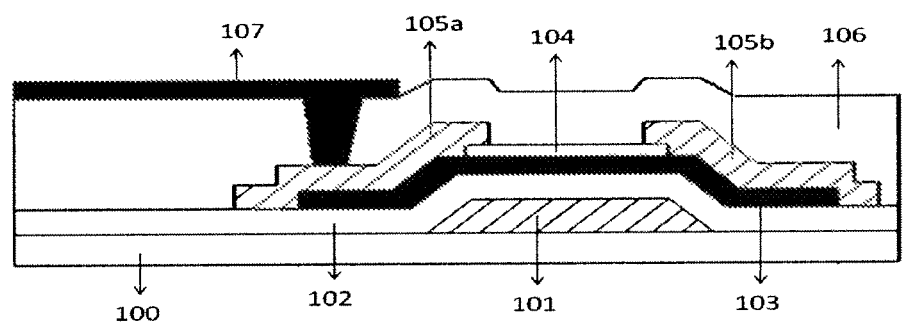
FIG. 1 is a schematic structure view of an oxide-TFT in the prior art.
Figure 2:
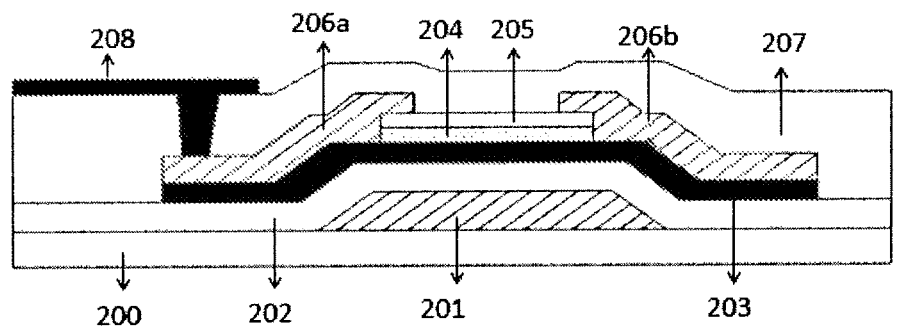
FIG. 2 is a schematic structure view of an oxide-TFT in an embodiment of the present invention.

As FIG. 2 shown, an oxide-TFT includes a substrate 200, a gate electrode 201 and a gate insulating layer 202 that are sequentially disposed on the substrate 200, an active layer 203 disposed on the gate insulating layer 202, and a blocking layer covering on the active layer 203. The blocking layer at least includes a first blocking layer 204 and a second blocking layer 205.

For example, the first blocking layer 204 is a low-hydrogen-containing silicon compound, e.g., low-hydrogen-containing silicon oxide (SiOx) or low-hydrogen-containing silicon nitride (SiNx). Generally, a silicon compound having a hydrogen content of 0.1%~5% is referred to as a "low-hydrogen-containing silicon compound." Herein, "hydrogen content" means the ratio of the amount of hydrogen-containing chemical bonds to the total amount of chemical bonds in the silicon compound. The second blocking layer 205 is a rich-silicon-containing silicon compound. The rich-silicon-containing silicon compound refers to a compound with a relatively high silicon content, e.g., x is 0.1<x<1 in SiOx, or x is 1<x<1.33 in SiNx.

In the oxide-TFT of the present embodiment, the blocking layer has a double-layer structure in design. Since the H+ content is low in the first blocking layer 204, the possibility of H+ contained in the blocking layer moving into the active layer is reduced. In addition, when H+ ions move into the second blocking layer 205 and meet Si, Si—H bonds will be formed, so the moving of H+ ions into the active layer is further blocked.

As one embodiment of the present invention, the active layer 203 contact the first blocking layer 204 of the blocking layer, i.e., the low-hydrogen-containing silicon compound layer, while the second blocking layer 205, i.e., the rich-silicon-containing silicon compound layer, does not directly contact the active layer 203. When H+ ions generated during etching diffuses downwardly, H+ ions move into the second blocking layer first, and then meet Si and form Si—H bonds, so the further diffusion of H+ is prevented. Since the first blocking layer 204 is the low-hydrogen-containing silicon compound, the possibility of the H+ ions therein moving into the active layer is reduced.

As another embodiment of the present invention, the active layer 203 may contact the second blocking layer 205, i.e., the rich-silicon-containing silicon compound layer, while the first blocking layer 204, i.e., the low-hydrogen-containing silicon compound layer does not directly contact the contact layer 203. Preferably, the second blocking layer 205 is SiOx in the present embodiment. The first blocking layer 204 has a thickness of for example 50 nm~100 nm, and the second blocking layer 205 has a thickness of for example 50 nm~100 nm.

Further, the blocking layer also may be in a multi-layer structure. For example, the active layer 203 contacts the first blocking layer 204 of the blocking layer, i.e., the low-hydrogen-containing silicon compound layer, while the second blocking layer 205, i.e., the rich-silicon-containing silicon compound layer, does not directly contact the active layer 203. A third blocking layer that is a low-hydrogen-containing silicon compound layer may be further disposed on the second blocking layer 205. In this end, invasion of H+ ions into the active layer can be further prevented. Certainly, the scope of the present invention is not limited thereto, and the blocking layer may be in a four-layer structure or in a structure having more than four layers. However, if the thickness of the multi-layer structure and the costs for manufacturing the same are considered, the present embodiment preferably uses a double-layer structure.

For example, the active layer 203 is an oxide film containing at least two elements of In, Ga, Zn, and Sn, e.g., IGZO, IZO, InSnO or InGaSnO. The thickness of the active layer is for example 10~100 nm.

Moreover, source/drain electrodes 206 (a source electrode 206a and a drain electrode 206b) ARE disposed on the blocking layer, and a passivation layer 207 and a pixel electrode 208 are disposed on the source/drain electrodes 206. The pixel electrode 208 is used for receiving signal voltages.

In the oxide-TFT of the present embodiment, the possibility of H+ ions coming into the active layer is reduced when the low-hydrogen-containing silicon compound is used as the first blocking layer. The rich-silicon-containing silicon compound is used as the second blocking layer, and when the H+ ions of the passivation layer diffuse into the second blocking layer, they meet Si, which is rich in the second blocking layer, to form Si—H bonds, and thus the H+ ions cannot further diffuse into the active layer. In this way, the characteristics of the TFT will not be deteriorated, and the usage life of the oxide-TFT is extended.

The present embodiment further provides an array substrate including the above described oxide-TFT. The detailed structure and principle of the oxide-TFT are same as the above described embodiment, so the detailed description is omitted.

The present embodiment further provides a display apparatus including the above described array substrate. The detailed structure and principle of the array substrate are same as the above described embodiment, so the detailed description is omitted.

An embodiment of the present invention provides a display apparatus including the array substrate in any one of the above described embodiments.

An example of the display apparatus is a liquid crystal display apparatus, in which an array substrate and an opposite substrate are opposite to each other to form a liquid crystal cell into which liquid crystal material is filled. The opposite substrate is for example a color filter substrate. The pixel electrode in each pixel unit of the array substrate is used for applying an electric field so as to control the rotation degree of the liquid crystal material to realize display. In some examples, the liquid crystal display may further include a backlight source providing backlight for the array substrate.

Another example of the display apparatus is an organic electroluminescence display apparatus, in which the source or drain electrode of oxide-TFT in each pixel unit of the array substrate is connected to the positive or negative electrode of the organic electroluminescence device, so as to drive an organic light-emitting material to emit light and thus to perform display.

Hereinafter, a method for manufacturing the above described oxide-TFT is provided, which comprises the following steps.

Step 101, forming a gate electrode layer on a substrate, and forming a pattern comprising a gate electrode and a gate line by a patterning process.

For example, first a gate electrode layer is deposited on a substrate. Then, a photoresist pattern is formed by coating a photoresist layer, exposing with a mask plate and developing the photoresist. A portion of the gate electrode layer is removed by an etching process with the photoresist pattern as an etch mask. After the etching process, the remaining photoresist is removed, and thus the pattern comprising the gate electrode 201 and the gate line is formed on the substrate. The substrate may be a quartz glass substrate, an ordinary glass substrate, a plastic substrate, etc.

In the present embodiment, the electrode 201 may be a single layer or a multilayer formed of one or more selected from Mo, MoNb, Al, AlNd, Ti, and Cu, preferably, a single layer or a multilayer of Mo and Al, or an alloy containing Mo and Al. The gate electrode may have a thickness of 1000~3000 nm, for example.

Step 102, forming a gate insulating layer and an active layer.

The gate insulating layer may be formed of SiOx, SiNx, HfOx, AlOx, or a multilayer formed of at least two the aforesaid materials. The gate insulating layer is preferably SiOx, SiNx, or a multilayer of them. The gate insulating layer may be formed by plasma enhanced chemical vapor deposition (PECVD), be made of silicon nitride (SiNx) and silicon oxide (SiOx), have a thickness of 100 nm~500 nm, preferably, 300~400 nm, and have a transmittance of 85% and more.

Further, the gate insulating layer 202 may also be formed by for example depositing an insulating film with a thickness of 300~500 nm with a physical sputtering method. The material of the gate insulating layer 202 may be $Al_2O_3$ or the like.

In PECVD, the gas containing elements for forming a thin film is ionized by microwave or radio frequency, etc., and then plasma is locally formed. Since the plasma has strong chemical activity and can easily react, a desired thin film can be deposited on the substrate. The chemical activity of the plasma can facilitate the reaction, so that the reaction can be performed at a low temperature, and thus it can be referred to as plasma enhanced chemical vapor deposition.

The active layer 203 is an oxide thin film containing at least two elements of In, Ga, Zn, and Sn, for example, IGZO, IZO, InSnO, or InGaSnO. The thickness of the active layer may be 10~100 nm, for example. The active layer of the present invention is preferably formed of IGZO and IZO.

For example, the active layer 203 can be formed by a magnetron sputtering method. The thickness of the active layer 203 is for example controlled to be 10~100 nm. During performing the magnetron sputtering process, the ratio of oxygen partial pressure to total partial pressure is for example 5%~50%, and the temperature is set to normal temperature.

Step 103, forming a first blocking layer, and performing a dehydrogenation process on the first blocking layer, the first blocking layer being a low-hydrogen-containing silicon compound.

The first blocking layer 204 is a low-hydrogen-containing silicon compound, for example, SiOx, SiNx, but not limited thereto. The thickness of the first blocking layer is preferably 50 nm~100 nm. The low-hydrogen-containing silicon compound is a silicon compound in which the ratio of the amount of hydrogen-containing chemical bonds to the total amount of chemical bonds is 0.1%~5%. The first blocking layer of the present embodiment is preferably SiOx.

Hereinafter, the process of forming the first blocking layer is described, in which SiOx is described as an example of the first blocking layer.

(1) A SiOx film is formed by a PECVD process. When the reactive atmosphere is SiH4+N2O+N2, the flow ratio of $SiH_4/N_2O$ is 1/40~1/60, the temperature is 150~350° C., and the pressure is 1000 mtorr~2000 mtorr. $N_2$ gas serves as a protection gas in the chemical reaction, and is used for controlling the chemical reaction rate. The higher the flow ratio of $N_2$ gas is, the more obvious the effect of diluting the reactive gas becomes, and thus the slower the chemical reactive is.

In the process of the chemical reaction, the higher the flow ratio of $N_2O$ gas, the relatively smaller the amount of the chemical bond containing H. However, in order to ensure the reaction between $SiH_4$ and $N_2O$ can be performed smoothly, when the amount of any one of $SiH_4$ and $N_2O$ is too low, the rate and quality of forming SiOx film can be affected. Thus, in the present embodiment, the flow ratio of $SiH_4/N_2O$ is set to 1/40~1/60, preferably, 1/50~1/55. Due to the described preferable flow ratio, the resulting blocking layer can have a smooth surface and a compact texture. After the deposition process, a dehydrogenization process such as annealing or the like is applied to the first blocking layer, so as to maintain the ratio of the amount of the hydrogen-containing chemical bonds to the total amount of the chemical bonds in a range of 0.1%~5%. For example, the hydrogen content is reduced largely if the product is kept within the PECVD apparatus at 230° C. for 10 minutes.

Some examples for forming the SiOx film are provided as follow.

First Example

In a PECVD film forming process, the reactive atmosphere is $SiH_4+N_2O+N_2$, the flow ratio of $SiH_4/N_2O$ is 1/40, the temperature is 150° C., and the pressure is 1000 mtorr. Thus, $SiH_4$ reacts with $N_2O$ to form SiOx and $NH_3$.

Second Example

In a PECVD film forming process, the reactive atmosphere is $SiH_4+N_2O+N_2$, the flow ratio of $SiH_4/N_2O$ is 1/50, the temperature is 250° C., and the pressure is 1500 mtorr. Thus, $SiH_4$ reacts with $N_2O$ to form $SiOx$ and $NH_3$.

Third Example

In a PECVD film forming process, the reactive atmosphere is $SiH_4+N_2O+N_2$, the flow ratio of $SiH_4/N_2O$ is 1/60, the temperature is 350° C., and the pressure is 2000 mtorr. Thus, $SiH_4$ reacts with $N_2O$ to form $SiOx$ and $NH_3$.

(2) When the reactive atmosphere is $SiH4+O2+N2$, in order to form the low hydrogen-containing silicon compound, the flow ratio of $SiH_4/O_2$ is 0.2~1, the temperature is 150~350° C., and the pressure is 1000 mtorr~2000 mtorr. During performing the chemical reaction, the higher the flow rate of $O_2$ is, the lower the content of H becomes. However, in order to ensure that the reaction between $SiH_4$ and $N_2O$ is performed smoothly, when the amount of any one of $SiH_4$ and $N_2O$ is too low, the rate and quality of forming $SiOx$ film can be affected. Thus, in the present embodiment, the flow ratio of $SiH_4/O_2$ is set to be 0.2~1, preferably, 0.3~0.5. $N_2$ gas serves as a protection gas in the chemical reaction, and is used for controlling the chemical reaction rate. The higher the flow ratio of $N_2$ gas, the more obvious the effect of diluting the reactive gas becomes, and thus the slower the chemical reactive is. In addition, due to the described preferable flow ratio, the resulting blocking layer can have a smooth surface and a compact texture. After the deposition process, a dehydrogenization process such as annealing or the like is applied to the first blocking layer, so as to maintain the content of H in a range of 0.1%~5%.

Some examples for forming the SiOx film are provided as follow.

First Example

In a PECVD film forming process, the reactive atmosphere is $SiH_4+O_2+N_2$, the flow ratio of $SiH_4/O_2$ is 0.2, the temperature is 350° C., and the pressure is 1000 mtorr. Thus, $SiH_4$ reacts with $O_2$ to form $SiOx$ and $H_2O$.

Second Example

In a PECVD film forming process, the reactive atmosphere is $SiH_4+O_2+N_2$, the flow ratio of $SiH_4/O_2$ is 0.5, the temperature is 250° C., and the pressure is 1500 mtorr. Thus, $SiH_4$ reacts with $O_2$ to form $SiOx$ and $H_2O$.

Third Example

In PECVD process, the reactive atmosphere is $SiH_4+O_2+N_2$, the flow ratio of $SiH_4/O_2$ is 1, the temperature is 150° C., and the pressure is 2000 mtorr. Thus, $SiH_4$ reacts with $O_2$ to form $SiOx$ and $H_2O$.

In addition, low-hydrogen-containing $SiNx$ may be formed by the following process.

In a PECVD deposition process, the reactive atmosphere is $SiH_4+NH_3+N_2$ or $SiH_4+NH_3+H_2$, the flow ratio of $SiH_4/NH_3$ is 1/8~1/10, the temperature is 250~400° C., and the pressure is 1200 mtorr~2500 mtorr. $N_2$ and $H_2$ gases serve as protection gases in the chemical reaction, so that the rate of the chemical reaction can be effectively controlled.

Step 104, forming a second blocking layer, and performing a dehydrogenation process to the second blocking layer, the second blocking layer being a rich-silicon-containing silicon compound.

The second blocking layer is a rich-silicon-containing silicon compound, such as, SiOx, SiNx, but not limit thereto. The thickness of the second blocking layer is preferably 50 nm~100 nm. Preferably, the second blocking layer of the present embodiment is formed of SiOx, in which x is 0.1<x<1.

Hereinafter, the process of forming the second blocking layer is described, in which SiOx is described as an example of the second blocking layer.

(1) SiOx film is formed by a PECVD process. In the PECVD apparatus, when reactive atmosphere is $SiH4+N2O+N2$, N2 gas serves as a protection gas in the chemical reaction, so that the rate of the chemical reaction can be effectively controlled. In order to forming rich-silicon-containing SiOx (x is 0.1<x<1), the flow ratio of $SiH_4/N_2O$ is 1/10~1/30, the flow ratio of $N_2/N_2O$ is 1/4~1/2, the temperature is 150~350° C., and the pressure is 1500 mtorr~2500 mtorr. Due to the described preferable flow ratio, the resulting blocking layer can have a smooth surface and a compact texture. After the deposition process, a dehydrogenization process such as annealing or the like can be applied to the second blocking layer.

Some examples for forming a SiOx film are described in the following.

First Example

In a PECVD film forming process, the reactive atmosphere is $SiH_4+N_2O+N_2$, the flow ratio of $SiH_4/N_2O$ is 1/10, the flow ratio of $N_2/N_2O$ is 1/4, the temperature is 150° C., and the pressure is 1500 mtorr. Thus, $SiH_4$ reacts with $N_2O$ to form $SiOx$ and $NH_3$.

Second Example

In a PECVD film forming process, the reactive atmosphere is $SiH_4+N_2O+N_2$, the flow ratio of $SiH_4/N_2O$ is 1/20, the flow ratio of $N_2/N_2O$ is 1/3, the temperature is 250° C., and the pressure is 2000 mtorr. Thus, $SiH_4$ reacts with $N_2O$ to form $SiOx$ and $NH_3$.

Third Example

In a PECVD film forming process, the reactive atmosphere is $SiH_4+N_2O+N_2$, the flow ratio of $SiH_4/N_2O$ is 1/30, the flow ratio of $N_2/N_2O$ is 1/2, the temperature is 350° C., and the pressure is 2500 mtorr. Thus, $SiH_4$ reacts with $N_2O$ to form $SiOx$ and $NH_3$.

(2) When the reactive atmosphere is $SiH_4+O_2+N_2$, in order to form the rich-silicon-containing SiOx (x is 0.1<x<1), the flow ratio of $SiH_4/O_2$ is 1~3, the temperature is 150~350° C., and the pressure is 1500 mtorr~2500 mtorr. $N_2$ gas serves as a protection gas in the chemical reaction, and is used for controlling the chemical reaction rate. In addition, due to the described preferable flow ratio, the resulting blocking layer can have a smooth surface and a compact texture. After the deposition process, a dehydrogenization process such as annealing or the like is applied to the second blocking layer.

Some examples for forming the SiOx film are provided as follow.

First Example

In a PECVD film forming process, the reactive atmosphere is $SiH_4+O_2+N_2$, the flow ratio of $SiH_4/O_2$ is 1, the temperature is 150° C., and the pressure is 1500 mtorr. Thus, $SiH_4$ reacts with $O_2$ to form SiOx and $H_2O$.

Second Example

In a PECVD film forming process, the reactive atmosphere is $SiH_4+O_2+N_2$, the flow ratio of $SiH_4/O_2$ is 2, the temperature is 250° C., and the pressure is 2000 mtorr. Thus, $SiH_4$ reacts with $O_2$ to form SiOx and $H_2O$.

Third Example

In a PECVD film forming process, the reactive atmosphere is $SiH_4+O_2+N_2$, the flow ratio of $SiH_4$ and $O_2$ is 3, the temperature is 350° C., and the pressure is 2500 mtorr. Thus, $SiH_4$ reacts with $O_2$ to form SiOx and $H_2O$.

In addition, the rich-silicon-containing SiNx may be formed by the following processes.

In a PECVD deposition process, the reactive atmosphere is $SiH_4+NH_3+N_2$ or $SiH_4+NH_3+H_2$, the flow ratio of $SiH_4/NH_3$ is 1/4~1/5, the temperature is 250~400° C., and the pressure for film forming is 1200 mtorr~2500 mtorr. $N_2$ and $H_2$ gases serve as protection gases in the chemical reaction, so that the rate of the chemical reaction can be effectively controlled.

Step 105, forming a source/drain metal layer, and forming a pattern comprising source/drain electrodes and the channel region of the TFT by a patterning process.

The source/drain metal layer is deposited on the resultant substrate after step 104, a photoresist layer is coated and then is exposed by using a half-tone or translucent second mask plate and developed, so as to define the locations and patterns of data line, the source/drain electrodes 206, and the channel region of TFT. Thus, the final patterns of the data line, the source/drain electrode, and channel region of TFT are formed by an etching process, etc.

In the present embodiment, the source/drain electrodes 206 (the source electrode 206a and the drain electrode 206b) may be a single layer or a multilayer formed of one or more selected from Mo, MoNb, Al, AlNd, Ti, and Cu, preferably, a single layer or a multilayer of Mo and Al, or an alloy containing Mo and Al.

Step 106, forming a passivation layer.

The passivation layer 207 may be formed of SiOx, SiNx, HfOx, or AlOx, or multilayer formed of at least two thereof.

Preferably, when the TFT of the present embodiment is formed to serve as a switching element of a pixel unit in the display device, the method for manufacturing the same may further include the following steps.

Step 107, forming a pixel electrode layer, and forming a pattern comprising a pixel electrode by a patterning process.

After depositing the pixel electrode layer, a photoresist layer is coated and then is exposed and developed by using a half-tone or translucent third mask plate, so as to define the location and pattern of the pixel electrode. Thus, the final pattern of the pixel electrode 208 is formed by etching process, etc.

In the present embodiment, the thickness of the pixel electrode is for example 350~1500 nm, and the transmittance is 85% or more. Further, with a sputtering process. amorphous ITO is deposited first, and then is etched to form a pattern; subsequently after the etching process, an annealing process is performed to form a crystallized ITO with low resistivity.

It is noted that: the oxide-TFT, the array substrate, the display apparatus, and the method for fabricating the oxide-TFT according to the embodiments of the present invention can be applied to not only a liquid crystal display but also other display device such as OLED.

In the method for manufacturing the oxide-TFT of the present embodiment, the possibility of H+ invading into the active layer is reduced by sequentially forming the first and second blocking layers and using a low-hydrogen-containing silicon compound as the first blocking layer. A rich-silicon-containing silicon compound is formed as the second blocking layer. When the H+ ions of the passivation layer invade into the second blocking layer, the H+ ions meet Si that is rich in the second blocking layer so as to form Si—H bonds, so that the H+ cannot further diffuse into the active layer. Thus, the property of the TFT can not be influenced, and the usage life of the oxide-TFT can be extended.

The above description only relates to exemplary embodiments of the present invention, but not limits the scope of the invention, the scope of which is defined by the following claims.

The invention claimed is:

1. A method for fabricating an oxide thin film transistor (oxide-TFT) comprising:
    forming a gate electrode layer on a substrate, and forming a pattern comprising a gate electrode and a gate line by a patterning process;
    forming a gate insulating layer and an active layer;
    forming a first blocking layer and a second blocking layer, wherein the first blocking layer is a silicon compound, a ratio of an amount of hydrogen-containing chemical bonds to a total amount of chemical bonds in the silicon compound is 0.1%~5%, the second blocking layer is SiOx, in which x is 0.1<x<1, or the second blocking layer is SiNx, wherein x is 1<x<1.33; and
    forming a source/drain metal layer, and forming a pattern comprising source/drain electrodes and a channel region of the TFT by a patterning process;
    wherein the second blocking layer is SiOx, which is prepared under following conditions: a reactive atmosphere is $SiH_4+N_2O+N_2$, a flow ratio of $SiH_4/N_2O$ is 1/10~1/30, a temperature is 150~350° C., and a pressure is 1500 mtorr~2500 mtorr; or
    the second blocking layer is SiOx, which is prepared under following conditions: a reactive atmosphere is $SiH_4+O_2+N_2$, a flow ratio of $SiH_4/O_2$ is 1~3, a temperature is 150~350° C., and a pressure is 1500 mtorr~2500 mtorr; or
    the second blocking layer is SiNx, which is prepared under following conditions: a reactive atmosphere is $SiH_4+NH_3+N_2$ or $SiH_4+NH_3+H_2$, a flow ratio of $SiH_4/NH_3$ is 1/8~1/10, a temperature is 250~400° C., and a pressure is 1200 mtorr~2500 mtorr.

2. The method according to claim 1, wherein the first blocking layer is silicon oxide, content of hydrogen of which is 0.1%~5%.

3. The method according to claim 2, wherein the first blocking layer is prepared under following conditions: a reactive atmosphere is $SiH_4+N_2O+N_2$, a flow ratio of $SiH_4/N_2O$ is 1/40~1/60, a temperature is 150~350° C., and a pressure is 1000 mtorr~2000 mtorr.

4. The method according to claim 2, wherein the first blocking layer is prepared under following conditions: a reactive atmosphere is $SiH_4+O_2+N_2$, a flow ratio of $SiH_4/O_2$ is 0.2~1, a temperature is 150~350° C., and a pressure is 1000 mtorr~2000 mtorr.

5. The method according to claim 1, wherein the first blocking layer is silicon nitride, content of hydrogen of which is 0.1%~5%.

* * * * *